(12) United States Patent
Calvert et al.

(10) Patent No.: US 9,536,659 B2
(45) Date of Patent: Jan. 3, 2017

(54) SOLENOIDAL MAGNETS COMPOSED OF MULTIPLE AXIALLY ALIGNED COILS

(75) Inventors: Simon James Calvert, Kidlington (GB); Russell Peter Gore, Abingdon (GB)

(73) Assignee: Siemens PLC, Camberley (GB)

( * ) Notice: Subject to any disclaimer, the term of this patent is extended or adjusted under 35 U.S.C. 154(b) by 1048 days.

(21) Appl. No.: 13/700,038

(22) PCT Filed: May 23, 2011

(86) PCT No.: PCT/GB2011/050963
§ 371 (c)(1),
(2), (4) Date: Nov. 26, 2012

(87) PCT Pub. No.: WO2011/148163
PCT Pub. Date: Dec. 1, 2011

(65) Prior Publication Data
US 2013/0176090 A1 Jul. 11, 2013

(30) Foreign Application Priority Data
May 26, 2010 (GB) .................. 1008742.7

(51) Int. Cl.
| | | |
|---|---|---|
| G01V 3/00 | (2006.01) |
| H01F 41/00 | (2006.01) |
| G01R 33/38 | (2006.01) |
| G01R 33/381 | (2006.01) |
| H01F 5/02 | (2006.01) |
| H01F 6/06 | (2006.01) |
| H01F 41/12 | (2006.01) |
| H01F 5/06 | (2006.01) |
| H01F 27/30 | (2006.01) |
| H01F 27/32 | (2006.01) |
| H01F 41/04 | (2006.01) |
| G01R 33/3815 | (2006.01) |

(52) U.S. Cl.
CPC .......... *H01F 41/005* (2013.01); *G01R 33/381* (2013.01); *G01R 33/3802* (2013.01); *H01F 5/02* (2013.01); *H01F 5/06* (2013.01); *H01F 6/06* (2013.01); *H01F 27/303* (2013.01); *H01F 27/327* (2013.01); *H01F 41/048* (2013.01); *H01F 41/127* (2013.01); *G01R 33/3815* (2013.01); *Y10T 29/4902* (2015.01); *Y10T 29/49071* (2015.01)

(58) Field of Classification Search
CPC .................................................. G01R 33/3802
USPC ...................... 324/319, 320; 335/216; 29/605
See application file for complete search history.

(56) References Cited

U.S. PATENT DOCUMENTS

| | | |
|---|---|---|
| 4,571,568 A | 2/1986 | Grangereau |
| 4,771,256 A | 9/1988 | Laskaris et al. |
| 4,848,103 A | 7/1989 | Pelc et al. |

(Continued)

FOREIGN PATENT DOCUMENTS

| | | |
|---|---|---|
| EP | 0122133 | 10/1984 |
| EP | 0 395 940 A2 | 11/1990 |

(Continued)

*Primary Examiner* — Louis Arana
(74) *Attorney, Agent, or Firm* — Schiff Hardin LLP

(57) ABSTRACT

A magnet assembly has a number of axially-aligned coils, the radial mid-point of each coil being axially-aligned with a portion of a radial extent of an adjacent coil in the assembly. Compression blocks are provided between adjacent coils at circumferential intervals, to retain the coils in fixed relative positions.

36 Claims, 12 Drawing Sheets

(56) References Cited

U.S. PATENT DOCUMENTS

| | | | |
|---|---|---|---|
| 4,896,128 A | | 1/1990 | Wollan et al. |
| 4,956,608 A | | 9/1990 | Dorri et al. |
| 5,402,094 A | * | 3/1995 | Enge .............. H01F 7/202 324/319 |
| 5,409,558 A | | 4/1995 | Takahasi et al. |
| 6,011,394 A | * | 1/2000 | Petropoulos ....... G01R 33/4215 324/318 |
| 6,882,152 B2 | | 4/2005 | Schuster et al. |
| 7,543,370 B2 | * | 6/2009 | Bittner ............... G01R 33/3802 29/592.1 |
| 7,849,587 B2 | | 12/2010 | Calvert et al. |
| 8,151,443 B2 | * | 4/2012 | Hobbs ............... G01R 33/3802 29/592.1 |
| 8,653,920 B2 | * | 2/2014 | Huang .................. H01F 6/06 335/216 |
| 2010/0109824 A1 | | 5/2010 | Wang |

FOREIGN PATENT DOCUMENTS

| | | |
|---|---|---|
| EP | 1741467 | 1/2007 |
| GB | 864836 A | 4/1961 |
| GB | 2408804 | 6/2005 |
| GB | 2426630 | 11/2006 |
| GB | 2437114 | 10/2007 |
| GB | 2 451 515 A | 2/2009 |
| JP | 57048217 | 3/1982 |
| JP | 58125805 | 7/1983 |
| JP | 62 067803 | 3/1987 |
| JP | 01274408 A | 11/1989 |
| JP | H01276707 A | 11/1989 |
| JP | H02228005 A | 9/1990 |
| JP | 03041705 A | 2/1991 |
| JP | 03250704 A | 11/1991 |
| JP | 09055543 A | 2/1997 |
| JP | 09148120 A | 6/1997 |
| JP | 11251133 | 9/1999 |

* cited by examiner

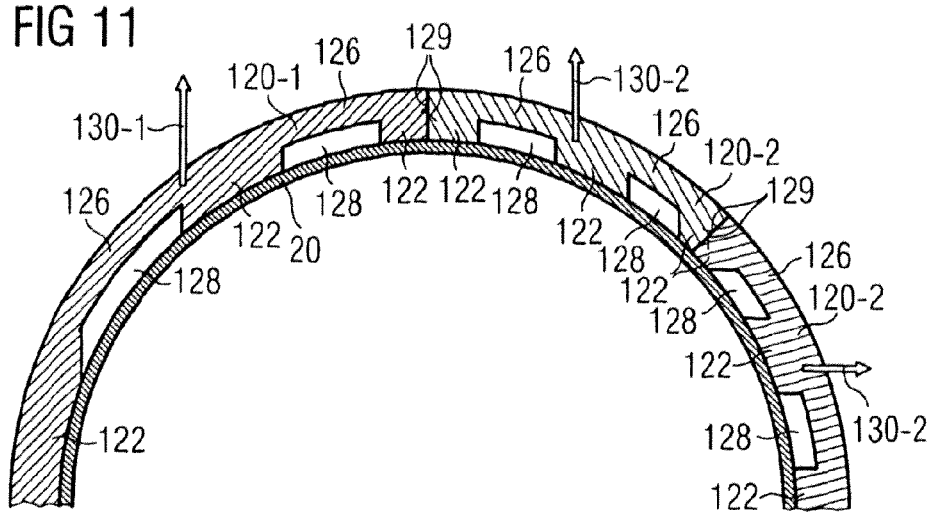
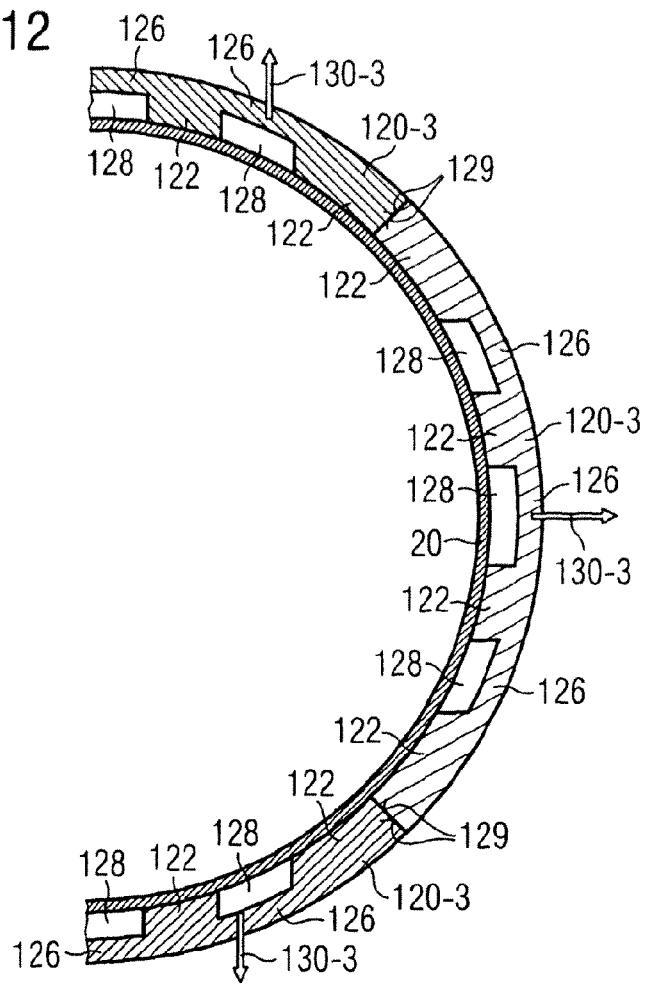

FIG 16
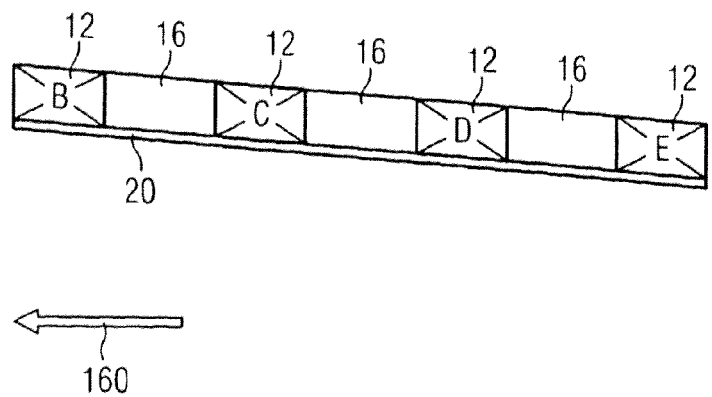
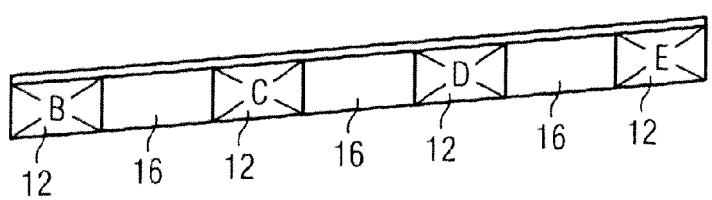
FIG 17
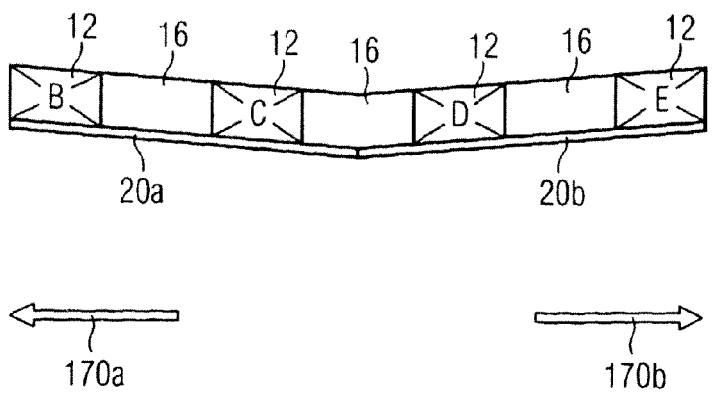
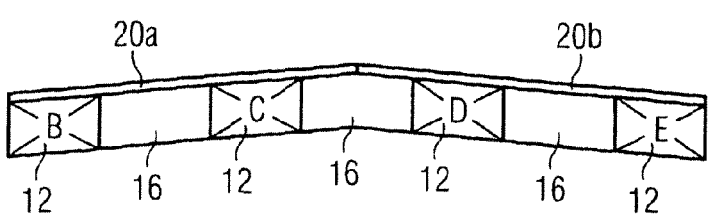

SOLENOIDAL MAGNETS COMPOSED OF MULTIPLE AXIALLY ALIGNED COILS

BACKGROUND OF THE INVENTION

Field of the Invention

The present invention relates to methods for the production of solenoidal magnets composed of several axially aligned coils, and solenoidal magnets so produced.

The present invention particularly relates to such solenoidal magnets for use as a magnetic field generator in a Magnetic Resonance Imaging (MRI) system. In particular, the invention relates to such magnets formed of superconductive wire.

Description of the Prior Art

In known magnet arrangements, a solenoidal magnet typically has end coils of relatively large number of turns, and hence larger cross-section and a number of inner coils of smaller number of turns and hence smaller cross-section. Conventionally, an accurately machined former, such as an aluminium tube, is provided with appropriately shaped slots into which wire is wound to form the coils. The coils may be impregnated with a thermosetting resin, either by wet-winding, in which a wire is passed through a bath of resin before being wound onto the former, or the coils may be wound dry, with the completed coils and former later being impregnated in a bath of resin. Similar impregnation may be performed with a wax, but the present description will refer to "resin" only, for brevity.

Alternatively, arrangements of moulded coils are known. In these arrangements, coils are wound into moulds, and the finished coil impregnated with resin within the mould. The resin is then cured, and a solid coil embedded in resin is produced. These moulded coils are then assembled into a magnet, for example by clamping onto a former or other mechanical support structure.

A known compromise arrangement has the inner coils, those toward the axial centre of the magnet, arranged on a former, with end coils moulded and mechanically attached to the former. The end coils tend to be larger in cross-section, and less critical in their placement. This compromise arrangement enables smaller, less expensive formers to be used, while maintaining accurate relative positioning between the inner coils.

These known arrangements suffer from certain drawbacks.

In use, magnet coils are subject to large forces, due to interaction of the coils with the magnetic fields produced. Some of these forces act axially, and urge the coil towards a wall of the former, while other forces act radially, tending to expand the coil to a larger diameter, or compress it onto the former. These forces may cause the coils to move relative to the former. Such movement may cause heating of the coils, which in superconducting magnets may lead to a quench.

The forces acting on the coils may cause the former to flex. The former needs to be large, heavy and mechanically robust to resist those forces. Due to flexure in the former, the force reaction path resisting the coil forces then acts essentially at the inner edges of the coils, which is misaligned from the line of action of the coil body force, which may be considered to act in an axial direction, through the radial mid-point of the coil cross-section. This contributes to a tendency to flex the former. The forces are also borne by a limited surface area of the coils. This may cause deformation of the coils themselves, which may also lead to quench in a superconducting coil.

The majority of the force acts upon the magnet's end coils, and shield coils if present. Inner coils are relatively lightly loaded, but are required to be the most accurately positioned in space to create a homogeneous field as required for imaging.

An accurately-machined former, as conventionally used, is expensive, and is only available from a limited number of suppliers. Transport costs from the former factory to the magnet winding facility may be significant. Storage of the large former may be difficult and costly.

Conventionally, separate coils wound within a former, or individually moulded coils are connected together by wiring and connections made after winding and impregnation of the coils is complete. Much time, and space, has been dedicated to ensuring that these connections are firmly retained in position, and cannot move when the magnet is in operation. A slight movement of these wires may be enough to cause the magnet to quench.

SUMMARY OF THE INVENTION

The present invention accordingly provides a new arrangement for the manufacture and retention of coils in their intended relative positions.

The arrangement of the present invention also provides rigid retention for the wiring and connections.

In accordance with the present invention, a magnet assembly has a number of coils, each formed by multiple turns of wire embedded within an impregnating material, and the coils are axially aligned with respect to each other so that a mid-point of a radial thickness of each coil is axially aligned with a part of radial thickness of an adjacent coil, and compression blocks are provided in contact with opposing faces of adjacent coils at circumferential intervals, the retaining blocks being separated by radial voids. The retaining blocks retain coils in fixed positions relative to each other.

BRIEF DESCRIPTION OF THE DRAWINGS

FIGS. 10-13 illustrate steps in a method of manufacturing a coil assembly according to an embodiment of the present invention.

FIG. 16 illustrates a step in a method of manufacturing a coil assembly according to an embodiment of the present invention, using a tapered bobbin.

FIG. 17 illustrates a step in a method of manufacturing a coil assembly according to an embodiment of the present invention, using opposing tapered part-bobbins.

DESCRIPTION OF THE PREFERRED EMBODIMENTS

Figure 1:
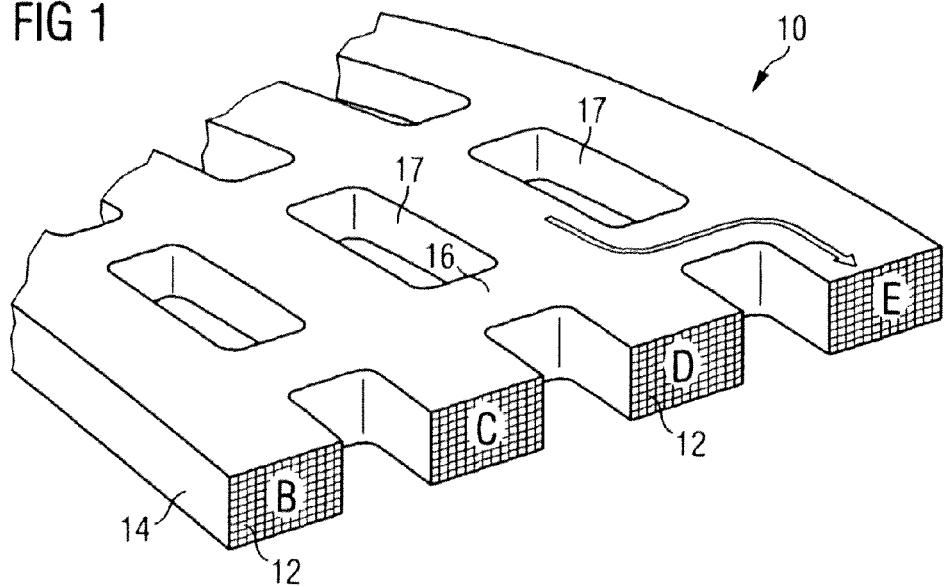
FIG. 1 shows a part-axial sectional view of a coil assembly according to an embodiment of the present invention.

FIG. 1 shows a part-axial sectional view of an inner coil assembly 10 according to an embodiment of the present invention. The coils are labelled 'B', 'C', 'D', 'E'. These are the inner coils of a magnet. End coils, known as 'A' and 'F', may be separately formed, and assembled with the illustrated inner coil assembly to form a completed magnet.

As illustrated in FIG. 1, the coils are formed of multiple turns of wire 12 embedded within a thermoset resin 14. Other impregnating materials may be used as appropriate for the size and intended use of the coils. Between the coils, cross-members 16, or compression blocks, are provided. These are positioned at intervals around the circumference of the coils, and serve to retain the coils in position relative to one another.

In the illustrated embodiment, the compression blocks 16 are formed of a porous material, such as a glass-fibre preform, or glass fibre felt or cloth, or a granular loose material such as glass beads, impregnated with the thermoset resin 14 or equivalent material. Preforms of glass-fibre may be sprayed with starch to improve the impregnation process.

The thermoset resin 14 or equivalent material forms a solid structure, enclosing and retaining the coils in their respective relative positions.

Figure 2:
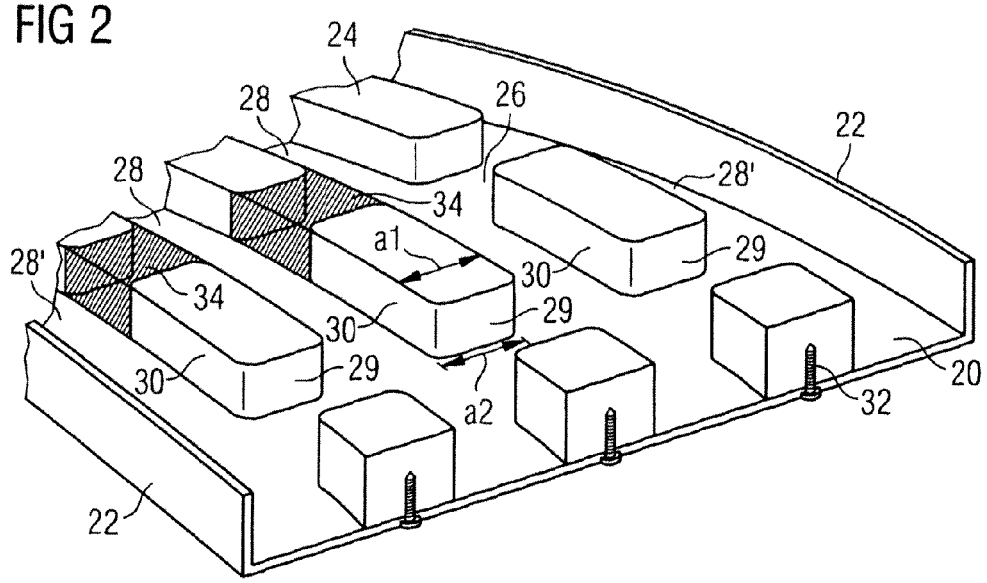
FIG. 2 shows a part-axial sectional view, corresponding to the view in FIG. 1, of a mould for winding a coil assembly as shown in FIG. 1.

FIG. 2 shows a part-axial sectional view, corresponding to the view in FIG. 1, of a mould for winding a coil assembly as shown in FIG. 1. A bobbin 20 is provided with edge flanges 22, of which at least one is removable. These edge flanges define the axial extent of the inner coil assembly 10. Winding cheeks 24 are disposed at defined axial positions, around the circumference of the bobbin 20. The winding cheeks are separated from one another around the circumference to define linking channels 26, and are separated from one another axially to define winding channels 28. Further winding channels 28' are formed between each edge flange 22 and the axially nearest set of winding cheeks 24.

The winding cheeks 24 are preferably arc-shaped in the circumferential direction, having radially-directed end surfaces 29. The winding cheeks may be provided with tapering sides 30, such that the axial extent a1 of a cheek at its radially outer surface is greater than its axial extent a2 at its radially inner surface, for reasons which will be discussed below.

The cheeks are removable, and may be held in place by mechanical retaining means such as threaded screws 32 passing from the radially inner side of the bobbin 30, through the bobbin and into complementary threaded holes within the cheeks.

In use, wire 12 is wound into the winding channels 28, 28' to form coils. The wire may be superconducting wire, well known in itself, particularly if a magnet for MRI imaging is to be produced. The linking channels 26 may be filled with a porous preform 34, such as foam or glass fibre moulding. During winding, the porous performs ensure that the wound wire remains within the winding channels 28, 28'.

Figure 3:
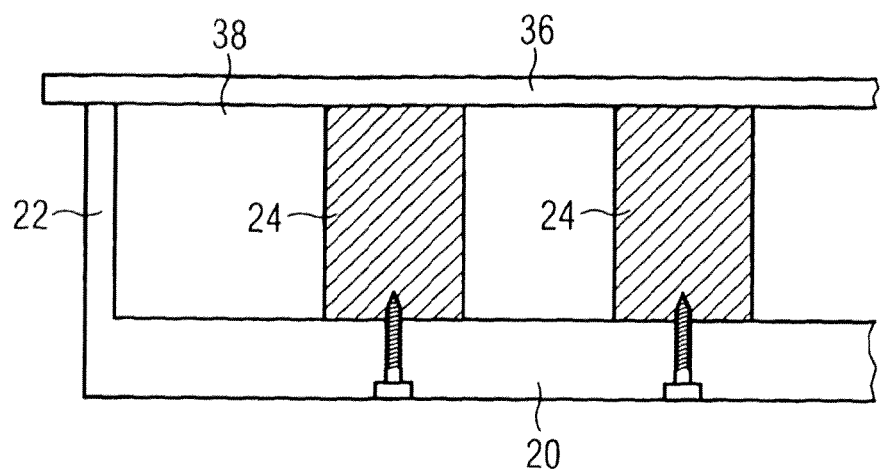
FIG. 3 shows partial axial and radial cross-sections through the apparatus of FIG. 2.

Once winding is complete, the moulding cavity 38 is closed, for example by a closure plate. The coil structures and the porous preforms are impregnated with a solidifying material such as epoxy resin, which is caused or permitted to harden. The resulting structure is a monolithic structure of the hardened material, which encloses the wire 12 and the porous preforms 34. During the impregnation step, the coils may be enclosed by a closure plate placed over the coils and moulding cheeks, to define an annular moulding cavity. FIG. 3 shows a part-axial cross-section through the structure of FIG. 2, illustrating a closure plate 36 forming an enclosed molding cavity 38.

In the illustrated case, all coils have an equal outer radius, as well as an equal inner radius, once impregnation is complete. Other arrangements may be provided for, enabling the coils of the structure to have differing outer radii.

Once the impregnation process is complete, the closure plate 36, if used, is removed. The winding cheeks 24 are also removed. The tapered sides 30 and radially-directed end surfaces 29 assist in removal from the hardened material. The winding cheeks may be covered with, or made of, a deformable material such as rubber, which would assist in their removal. The winding cheeks 24 may be coated with a suitable release agent to assist their removal from the solidified material.

The resulting impregnated coil assembly 10 is then removed from the mould, for example by removing one of the edge flanges 22 and sliding the assembly axially off of the bobbin 20. The edge flanges and the outer surface of the bobbin may be coated with a suitable release agent to assist the removal of the solidified coil assembly.

Referring back to FIG. 1, it can be seen that cross-members 16 are now formed where linking channels 26 were provided. The coils are held in precise relative positions, and this has been achieved at relatively low cost. No former is required to hold the coils circumferentially, or in their relative axial positions. The cross-members 16 support the electromagnetic forces acting on the coils and so perform the function of compression blocks, reacting body forces acting on the coils. As the cross-members 16 are provided in the plane of the axial forces, there is no need for an external structure to bear those loads. Forces acting to circumferentially expand or contract a coil will be restrained by the mechanical strength of the coils themselves. The inner coil assembly 10 may, if required, be supported on a simple tubular support, applied within the inner diameter, or outside the outer diameter, of the inner coil assembly. However, no axial-load-bearing former is required.

The completed structure has cross-members 16 separated by voids 17 corresponding to the former position of winding cheeks 24. The voids are an advantageous feature, as they allow each coil to radially expand or shrink relatively independently. In addition, the presence of the voids reduces the amount of resin used as compared to an arrangement in which voids were not provided. This reduces the cost and environmental impact of the resin used.

The precisely formed parts are the bobbin 20, the end flanges 22 and the winding cheeks 24. All of these can be used several times over. Each coil consumes only the inherent amount of wire, plus inexpensive components: the hardening material, typically epoxy resin, and the porous preforms, typically of glass fibre and resin. The monolithic structure ensures that the coils 12 are firmly held in their respective relative positions.

FIG. 16 shows an axial cross-section through a magnet assembly according to an embodiment of the present invention, in which coils 12 and cross-members 16 are formed on the outer surface of bobbin 20. In this case, the bobbin is tapered, to a conical shape. However, the taper is much exaggerated in the drawing, for illustration, and the outer surface of the bobbin may still be regarded as being essentially cylindrical, with the taper being only equivalent to a 1 mm-2 mm change in diameter over 1 m axial length. Once the magnet assembly has been formed by the methods described herein, the bobbin may be removed in direction 160. The taper on the bobbin allows the bobbin to become free from the magnet structure as soon as it moves, and will not cause damage to the magnet structure as it is removed. If the bobbin were exactly cylindrical, removal would be difficult, and the surface of the bobbin would rub across the inner surface of the magnet structure as it is removed, possibly causing damage to the magnet structure. Of course, a magnet structure formed in this way will have some coils (B, C in this example) with a larger diameter than other coils (D, E in this example). The effect that this may have on the magnetic field generated by the structure may be compensated for in advance, by adapting the number of turns, or the axial position, of some or all of the coils.

FIG. 17 illustrates another axial cross-section through a magnet assembly according to an embodiment of the present invention, in which coils 12 and cross-members 16 are formed on the outer surface of a bobbin. In this case, the bobbin is made up of two separate parts 20*a* and 20*b*. Both parts are tapered, to a conical shape. The narrow ends of the parts 20*a*, 20*b* are placed adjacent to one another, toward the axial centre of the magnet structure. The taper is much exaggerated in the drawing, for illustration, and the outer surface of the bobbin may still be regarded as being essentially cylindrical, with the taper being only equivalent to a 1 mm-2 mm change in diameter over 1 m axial length.

Once the magnet assembly has been formed by the methods described herein, each the bobbin part 20*a*, 20*b* may be removed in respective direction 170*a*, 170*b*, axially away from the axial centre of the magnet structure. The taper on each bobbin part allows the bobbin to become free from the magnet structure as soon as it moves, and will not cause damage to the magnet structure as it is removed. If the bobbin were exactly cylindrical, removal would be difficult, and the surface of the bobbin would rub across the inner surface of the magnet structure as it is removed, possibly causing damage to the magnet structure.

Of course, a magnet structure formed in this way will have some coils (B, E in this example) with a larger diameter than other coils (C, D in this example). The effect that this may have on the magnetic field generated by the structure may be compensated for in advance, by adapting the number of turns, or the axial position, of some or all of the coils. However, in this example, symmetry of the structure means that nominally identical coils, C and D; and B and E, will have same radii, simplifying this compensation. This assumes that both bobbin parts have the same taper, and meet at the axial mid-point of the magnet.

An alternative manner of forming a structure similar to that shown in FIG. 17 would be to form two part-magnet structures in the manner shown in FIG. 16, and then to join them together, for example by a resin bond. This may be particularly applicable to large magnets, which are manufactured in small numbers. However, such joining step is not preferred as it is time consuming and difficult to form the bond with the required accuracy. For volume production, it is preferred to form the magnet structure and perform impregnation of the structure in a single piece. An advantage of forming the magnet structure in two separate pieces, each similar to that shown in FIG. 16 and then joining them together is that the larger-diameter ends of the pieces may be joined together toward the axial center of the magnet, so that the coils nearest the axial center of the magnet have a greater diameter than those near the ends of the magnet, which is conventionally regarded as assisting in the production of a homogeneous magnetic field, as required for MRI imaging.

Figure 4:
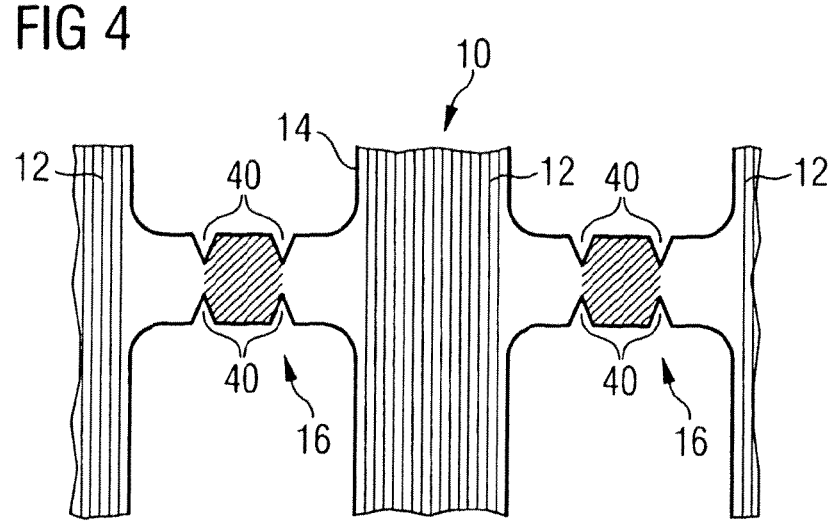
FIG. 4 shows stress-raising features in cross-members of coil assemblies of the present invention.

FIG. 4 illustrates a feature of an embodiment of the invention, whereby separation of the moulded coils is facilitated. By using suitably shaped winding cheeks, stress raising features, in this case notches 40 may be formed in the cross-members 16. The presence of these stress-raising features makes it easier to break the cross-member 16 if required, for example by using a chisel or hammer blow, snapping off with grips or sawing. The stress-raising features 40 are preferably formed some distance away from the wire 12 of the adjacent winding, so that any damage caused to the hardened material 14 would not affect the coils themselves. In addition to providing for the removal of a coil in case of a manufacturing defect or damage, the removable cross-members shown in FIG. 4 may be removed to allow relative movement between the coils, if it becomes apparent that such movement is necessary. Once the removable cross-members have been removed, a more conventional arrangement will be required to hold the coils in their relative positions.

The process of forming joints between the several lengths of wire typically used in forming a coil assembly such as shown is known to be costly and time consuming, requires noxious chemicals and is a source of failure of the resulting magnet structure. Some embodiments of the present invention provide a reduction in the requirement for providing superconducting joints.

The provision of joints may be reduced by winding several, or all, of the coils B, C, D, and E of the inner coil assembly 10 from a single length of wire. Assuming that all coils are to be connected in series, a first coil B may be wound from the wire, then the wire carried through linking channel 26, for example by making a suitable cut or cavity in the preform, and used to wind the next coil C and so on. Such an arrangement may, however, lead to sites susceptible to defects where the wire joins an external radius of one coil to the internal radius of the next coil. A protective guide, for example of moulded plastic, may be provided to prevent the part of the wire joining two coils from bearing with too much pressure on the turns of a coil. In such arrangements, the removable cross-members of FIG. 4 should not be employed, as the wire will pass through the cross-member.

An equivalent end result may be obtained by first winding a first layer of wire into coil B; moving the wire through a linking channel 26 to wind a first layer of wire into coil C; and so on until a first wire layer is wound into coil E; winding a second layer of wire onto coil E; moving the wire through a cross-member 16 to wind a second layer of wire into coil D; and so on until a second wire layer is wound into coil B. In this arrangement, the wire never transitions more than one layer, so the possible failure sites introduced by joining the external radius of one coil to the internal radius of an adjacent coil do not arise. Again, the removable cross-members of FIG. 4 should not be used.

Figure 5:
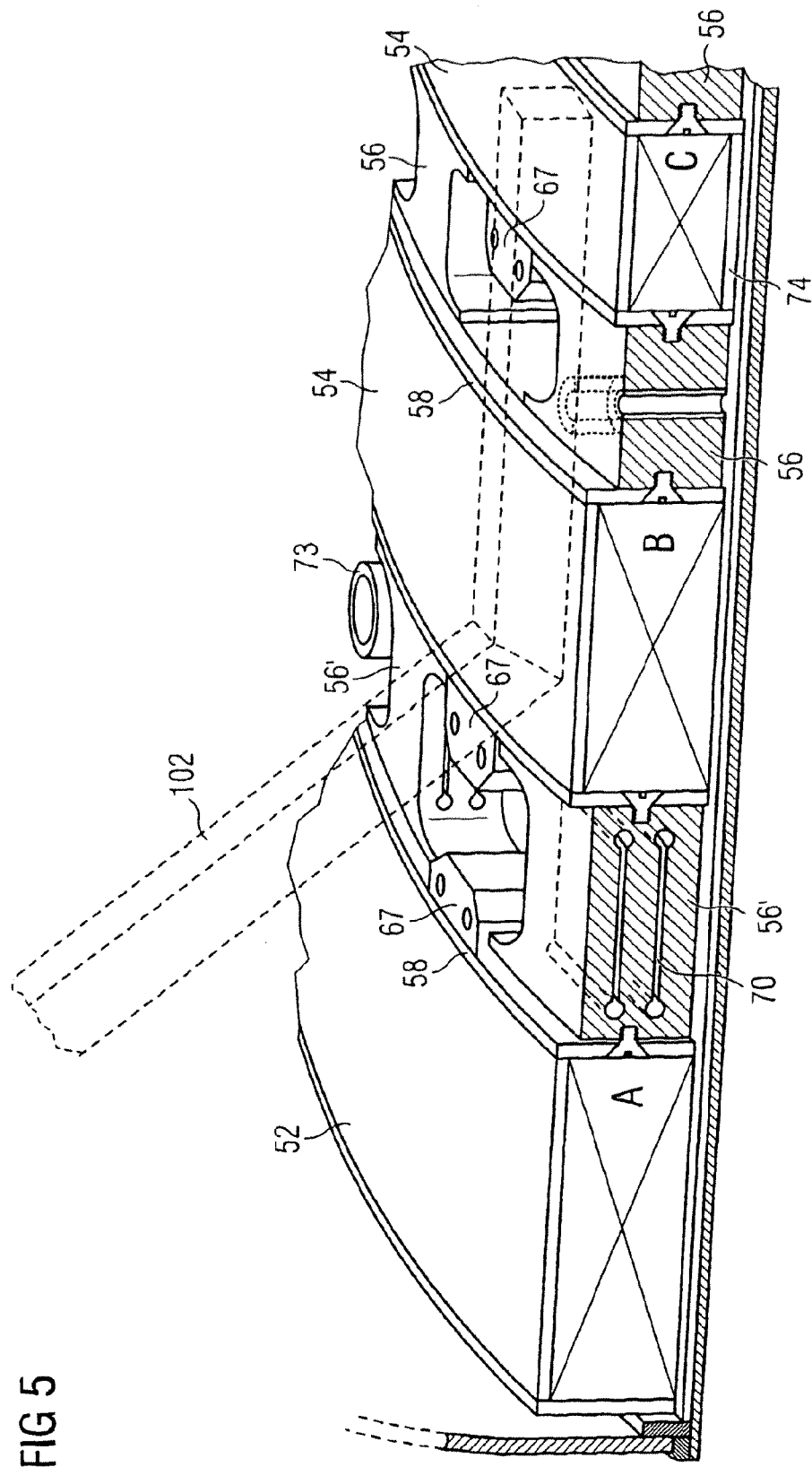
FIG. 5 illustrates a coil assembly according to another series of embodiments of the present invention.

FIG. 5 illustrates a coil assembly according to another series of embodiments of the present invention. FIG. 5 shows an axial part cross-section of a six-coil magnet. End coil A is shown at 52, along with inner coils B and C, at 54. Respectively corresponding further coils D, E, F are provided, but are not shown in the drawing. In these embodiments, the coils A-F are molded individually to produce separate moulded coils. These coils are joined together by compression blocks 56 placed at intervals around the circumference of the coils to provide an axially self-supporting assembly in the plane of axial forces acting upon the coils. This means that a lighter structure may be provided, which is still capable of resisting those axial loads. No bulky, heavy and expensive load-bearing former is required.

Typically, epoxy resin is used as the impregnating material, and the resulting impregnated coils have a very high inherent mechanical strength. The present invention uses this inherent mechanical strength, in contrast to conventional former-based magnet designs, which largely rely on the strength of the former for the strength of the magnet assembly as a whole. According to this embodiment of the present invention, a number of compression blocks 56 are provided between, and supporting, the coils 52, 54. These blocks are strong in compression. They may be adhesively bonded to the coils, using an adhesive material which is compatible with the material of the blocks, and with the material used for impregnation of the coils.

Figure 6:
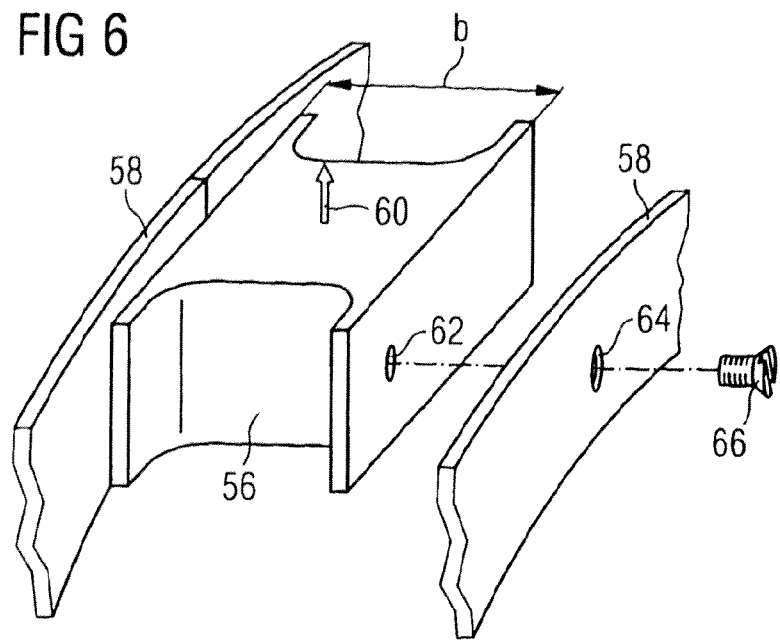
FIG. 6 shows more detail of the embodiment of FIG. 5, illustrating a compression block.

FIG. 6 shows more detail of the assembly including the compression blocks. The compression blocks 56 may be formed as an aluminium extrusion, being inexpensive and non-magnetic. Preferably, the extrusion is performed in the direction 60, with a wide "I" cross-section, and the resultant extrusion sliced to form the compression blocks 56. Most of the dimensions of the blocks are not critical, and so are well suited to an inexpensive manufacturing technique such as extrusion. On the contrary, the axial dimension b of the compression block must be accurate, as that dimension determines the separation between the coils in the finished magnet, which is crucial in achieving the designed homogeneity in the generated magnetic field. In a preferred embodiment, the extrusion is made slightly too large in this dimension b, and the compression blocks formed from the extrusion are milled to size, in this dimension only. Such milling is a relatively simple and inexpensive process, yet is relatively accurate. The resultant surfaces may be specially prepared, for example by anodising, for adhesive bonding to adjacent components.

Figure 6A:
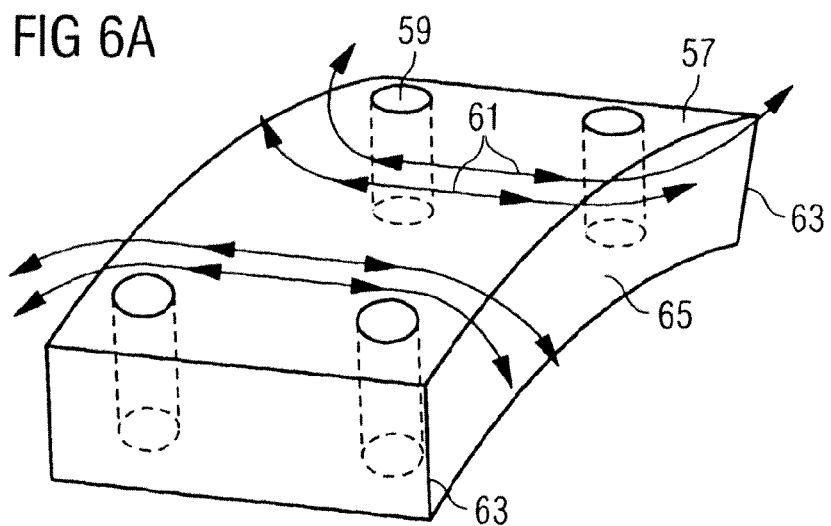
FIG. 6A shows an alternate type of compression block.

FIG. 6A shows an alternate type of compression block 57. The compression block is of essentially rectangular cross-section in direction 60 and may be produced by extrusion. It has holes 59 in approximately radial directions, formed near the corners of the essentially rectangular cross-section. These holes allow some flexibility to the compression block, and cause the compression forces 61 to travel preferentially through the main body of compression block 57, similar to the stress paths of compression block 56. The flexure introduced by holes 59 prevents high compressive forces on radially-directed edges 63 of the compression block 57, similarly to the flexure of the radially directed edges of the compression block 57 of FIG. 6. Surfaces 65 may be machined, and surface prepared, in a similar manner to that described for the compression blocks of FIG. 6.

Preferably, the compression blocks 56 are not attached directly to the coils. As shown in FIG. 6, arcs 58 of sheet electrical isolator, preferably one which effectively bonds with the resin used for impregnation of the coils, are provided between each compression block 56 and the adjacent coils 52, 54. Examples of suitable material include glass fibre reinforced epoxy resin, sheets of phenolic resin, such as those sold under the name "TUFNOL Grade 10G/40". The sheet electrical isolator is cut into arc shapes 58, having a curvature to match the corresponding coil, and having a circumferential extent equivalent to a multiple of the circumferential distance between centers of the compression blocks 56. The arcs 58 are attached to the compression blocks 56 either adhesively or mechanically. As shown in FIG. 6, this may be achieved by drilling and tapping holes 62 in the load-bearing faces of the compression blocks 56; providing corresponding untapped, countersunk holes 64 in the arcs 58, and attaching the arcs 58 to the blocks 56 with nylon screws 66. The compression block 56 may also be adhesively bonded to the arcs 58. Blocks 56 and arcs 58 may be assembled into complete rings, which are then adhesively bonded to adjacent coils, which are accurately located in a jig or similar structure for this part of the process.

The wide "I" section of the extrusion 56 is believed to provide a useful distribution of compressive force onto the surfaces of the adjacent coils 52, 54, without providing an abrupt edge which might cause high localised compression forces.

Illustrated in FIG. 5 are in-out blocks 67. These may be of known construction. They serve to protect parts of the superconducting wire which protrude from the coil—typically, the start and end of each coil, and connections as required to make joins between multiple lengths of wire. For example, each in-out block 67 may be made up of a stack of thermoplastic plates, each provided with one or more guide channels suitable for accommodating superconducting wire as used in the coil. The protruding parts of superconducting wire are placed in one of the channels, at a radial location matching the point at which the wire protrudes from the coil. The in-out blocks may be built up as the coil is wound, and impregnated with the coil, to become firmly bonded to the coil.

Figure 7:
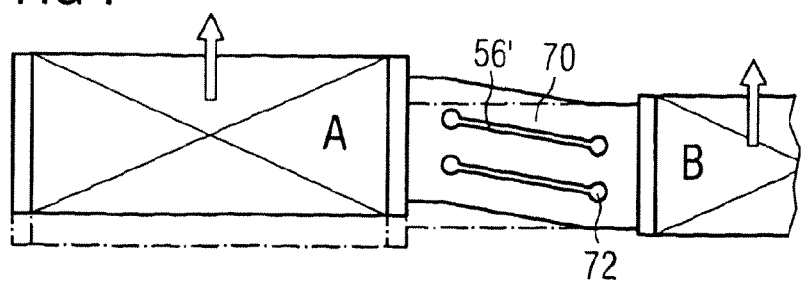
FIG. 7 illustrates the flexure of one of the compression blocks shown in FIG. 5.

A variant of the compression blocks 56 is shown in FIG. 5, located between coils A and B, and illustrated in greater detail in FIG. 7. The end coil A is considerably larger than the inner coils B, C, and is subjected to a larger radial force, commonly known as hoop stress. This may cause end coil A to expand radially to a greater extent than the adjacent coil B. This would put a great radial bending load on a solid compression block 56. To reduce this load, and the stresses which it would put on the coils 52, 54, a modified compression block may be used, as shown in FIGS. 5 and 7. The modified compression block 56 is provided with axially-extending slots 70 which extend through the compression block 56. These slots 70 substantially divide the block into a plurality of radially thinner blocks joined at their axial ends. Such arrangement may be more easily deformed than the solid block. FIG. 7 illustrates the flexure of one of the compression blocks shown in FIG. 5. The degree of flexure is exaggerated for clarity.

As illustrated in FIG. 7, the slots 70 allow the end coil A to expand radially to a greater extent than inner coil B. In a preferred embodiment, the slots 70 have enlarged sections 72 at each end thereof, to assist in flexure of the block, and to reduce the incidence of metal fatigue at the ends of the slots. The slots 70, and any enlarged sections 72, may be formed by operation of a high-pressure water jet. Equally, they may be formed by more conventional means, such as drilling and sawing.

Conventional superconducting joints 73 may be provided in locations between compression blocks 56.

As illustrated in FIG. 5, coils C and D have a rather smaller cross-section than the other coils. The axial loads acting on coils A and B; and E and F must be supported by the structure of coils C and D. As these coils are of relatively small cross-section, layers of reinforcement 74 may be provided, for example around the radially inner and/or radially outer surfaces of the coils C and D. This may take the form of strengthening wires, for example of aluminium or stainless steel, which are wound with the coil, and included in the impregnation step. The effects of these strengthening wires are to increase the mechanical strength of the coils themselves, and to increase the radial dimension of the coils, thereby enabling thicker, stronger, compression blocks 56 to be used.

FIGS. 8A-8D show steps in an example method of constructing an assembly of magnet coils according to an embodiment of the present invention, similar to the embodiment described with reference to FIGS. 5-7, but in which the coils are wound in-situ, between compression blocks and arcs.

Figure 8A:
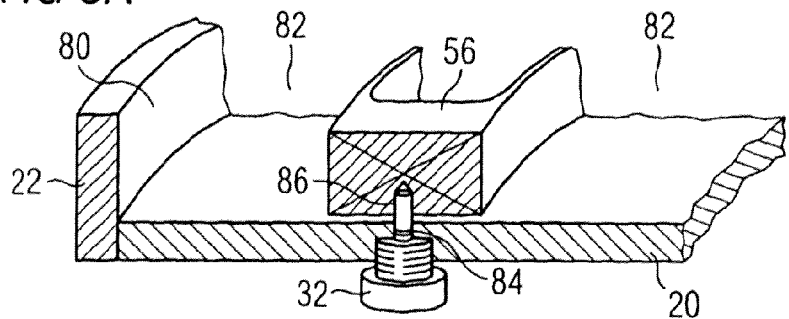
FIGS. 8A-8D show steps in an example method of constructing an assembly of magnet coils according to an embodiment of the present invention.

FIG. 8A shows the initial step of preparing the mould. A layer of porous PTFE 80 is laid over the inner surface of the mould; over the bobbin 20 and the end flanges 22. This assists with releasing the finished article from the mould. Compression blocks 56 are located over the bobbin 20 at required axial positions, and regular circumferential intervals, to define winding channels 82. Corresponding through-holes 84 are provided, allowing retention screws 32 to pass through the bobbin 20 into a corresponding threaded hole 86 in the compression blocks. One or more holes 86 and screws 32 may be provided for each compression block.

Figure 8B:
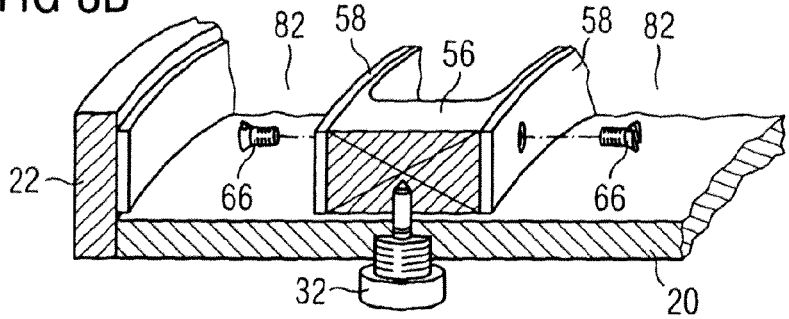

As illustrated in FIG. 8B, arcs 58 are now positioned to delimit the winding channels 82. As discussed with reference to FIG. 6, the arcs 58 may be attached to the compression blocks 56 by fixing means such as nylon screws 66.

Figure 8C:
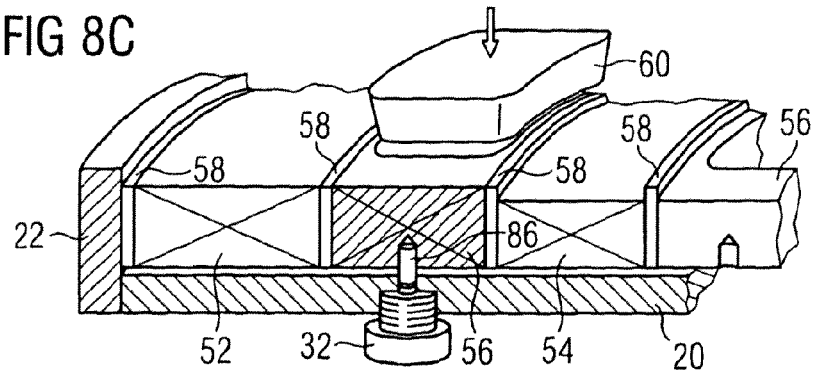
Figure 8D:
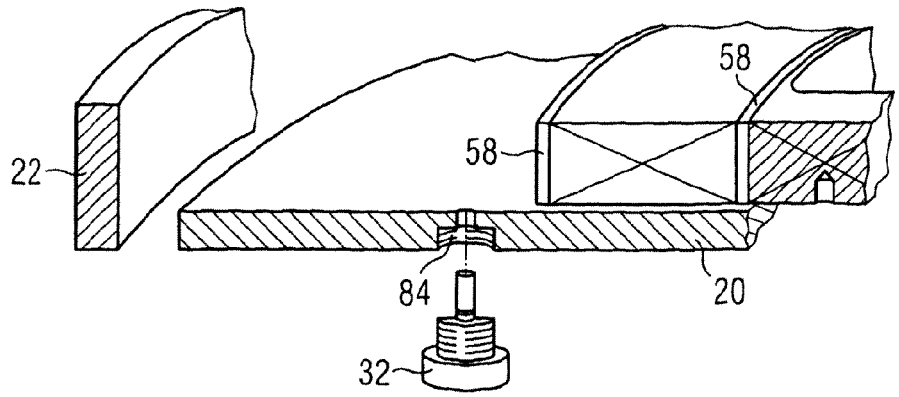

As shown in FIG. 8C, deformable displacers 60 of suitable size and shape may be inserted between adjacent compression blocks 56 and arcs 58. These support the arcs, which form walls of the winding channel 82 as the coils 52, 54 are wound. The assembly as shown in FIG. 8C, including the displacers 60, is impregnated with a hardening material such as an epoxy resin, to impregnate the coils, bond them to the arcs 58, and to further bond the arcs to the compression blocks 56.

Similarly to the arrangement shown in FIG. 3, a closure plate may be provided to enclose a hallow cylindrical molding cavity around the coils. By filling the molding cavity with hardening material and allowing or causing it to solidify, an impregnated structure may be formed, having a constant outer radius. Filler material may be provided over the outer surface of the wound coils, to bring them to a common outer radius. For example, fibreglass tape may be used. This is useful if the coil assembly is to be attached to an outer cylindrical support structure, as the support structure then need only be a simple tube of constant inner radius. The deformable displacers 60 may be removed once the hardening material has hardened.

In alternative embodiments, a more complex closure plate arrangement may be used, such that the coils may be impregnated and moulded so as to have differing external radii.

Once the impregnation step is complete, the coil assembly is removed from the mould. Screws 32 are removed from the compression blocks 56, and edge flanges 22 are removed. The surface of the resulting coil assembly is covered with the porous PTFE layer 80, which assists in removal of the mold pieces. To assist removal of the coil assembly from the bobbin 20, the surface of the bobbin is preferably slightly tapered.

The advantages of tapered bobbins, together with certain examples, were shown in FIGS. 16-17 and the corresponding description. Such tapered bobbins may be employed with any of the example methods and structures of the present invention.

Figure 9:
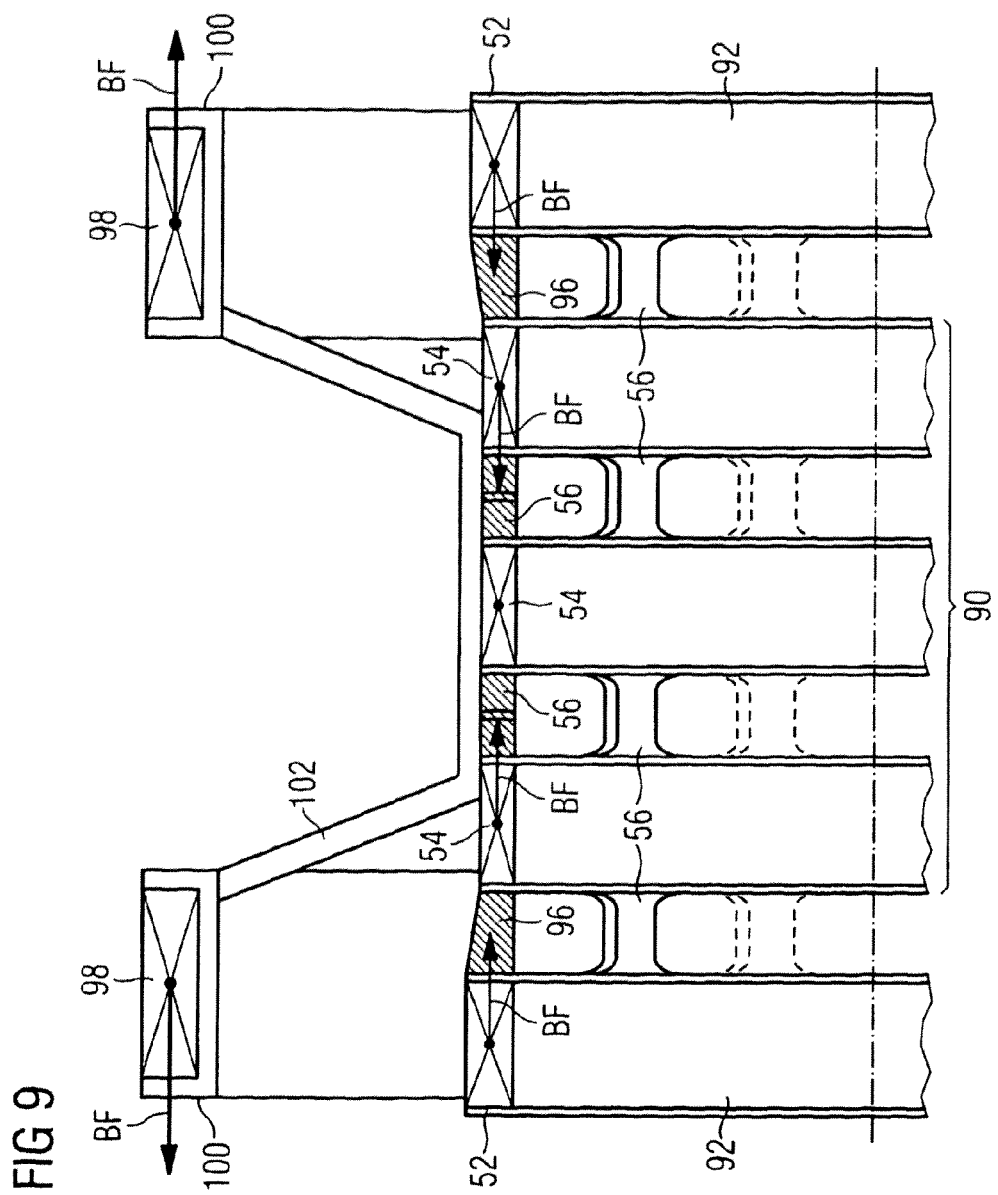
FIG. 9 shows how a coil assembly as described above may be incorporated into a complete magnet structure.

FIG. 9 shows how a coil assembly as described above may be incorporated into a complete magnet structure. An inner coil assembly 90 is provided, according to any of the methods described above. In the example shown in FIG. 9, three coils are shown in the inner coil assembly. However, the present invention may be applied to inner coil assemblies with any number of coils. In inner coil assemblies with an odd number of coils, an inner coil will be present. Where an inner coil assembly has an even number of coils, the axial midpoint of the assembly will typically lie between two coils. Separate end coils 92 are provided in the example of FIG. 9. These are typically wound into a mold and impregnated with a hardening material such as an epoxy resin. Once the material has hardened, the coils become robust self-supporting coils. They may be attached to the inner coil assembly using compression blocks 96, for example of the aluminium extrusion discussed above. Typically, the end coils 52 are of differing dimensions as compared to the coils 54 of the inner coil assembly, and the compression blocks 96 may need to be specially shaped in the radial direction to interface acceptably with the end coils 52 and with the inner coil assembly 90. In the example illustrated in FIG. 9, body forces BF acting on the various coils when in use tend to urge the coils 52, 54 toward a central plane, at the axial mid-point of the magnet. This ensures that the compression blocks 56, 96 are all in compression. The compression blocks have great strength in compression, but the bonds holding the coils to the compression blocks would be less strong in tension. The direction of forces acting on each coil is a feature of the design of each magnet.

In many superconducting magnets, active shield coils 98 are provided. They have a greater radius than either the inner coils 54 or the end coils 52. In use, the shield coils 98 carry current in a direction opposite to the direction of current generally carried by the inner coils 54. The body force BF acts to urge the shield coils away from the axial mid-plane of the magnet, in the illustrated example.

FIG. 9 shows an example arrangement of shield coils 98 retained in position around a coil assembly of the present invention. In the illustrated arrangement, shield coils 98 are held in corresponding journals 100, which are themselves attached to the coil assembly of the present invention by retaining webs 102, also illustrated in FIG. 5. Other arrangements may be provided for retaining the shield coils in position, for example a simple frame, mounted to a corresponding position on axially-aligned compression blocks 56. Depending on the mechanical forces involved, which may be calculated by simulation, a frame or web may be mounted on each set of axially-aligned compression blocks 56; or every other set of axially-aligned compression blocks 56; or every third set of axially-aligned compression blocks, for example. It is, in general, preferred for the compression blocks 56 to be axially aligned, to avoid any bending moments to be applied to the coils, as would be the case if the compression blocks were not axially aligned.

An arrangement such as shown in FIG. 9 may be constructed with an inner coil assembly 90 of a monolithic resin impregnated assembly as shown in FIG. 1, or an assembly composed of molded coils and extruded compression blocks, as shown in FIG. 5. The inner coil assembly 90 may be according to any embodiment of the present invention.

A preferred embodiment of the coil assembly and method of the present invention will be discussed with reference to FIGS. 10-12.

A structure formed according to the preferred embodiment is similar to that illustrated in FIG. 1, in which coils formed of multiple turns of wire 12 are embedded within a thermoset resin 14 or similar. Between the coils, cross-members 16, or compression blocks, are provided. These are positioned at intervals around the circumference of the coils, and serve to retain the coils in position relative to one another.

Figure 10:
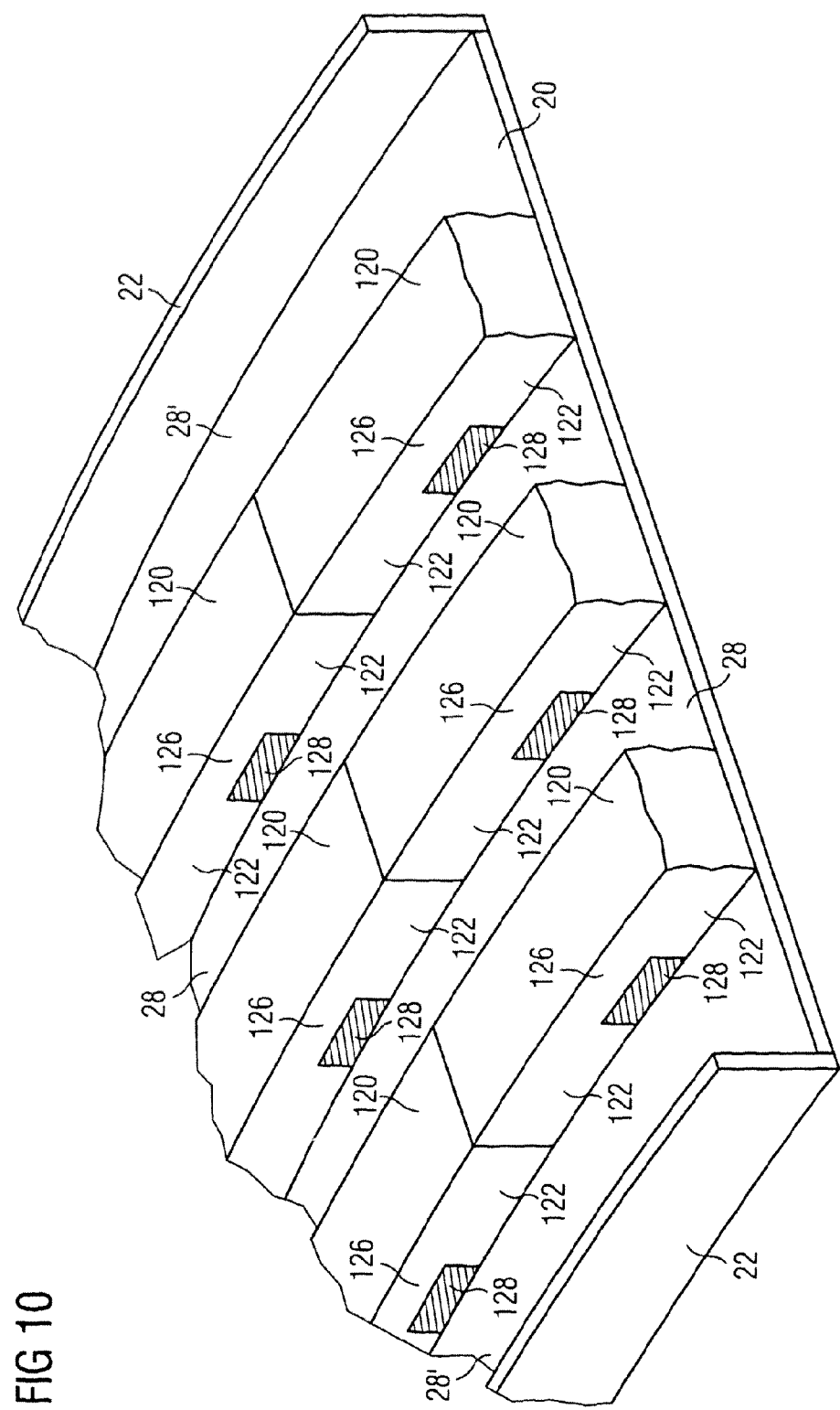

FIG. 10 shows a part-axial sectional view, corresponding to the view in FIG. 2, of a mould for winding a coil assembly according to the present invention. Bobbin 20 is provided with edge flanges 22, of which at least one is removable. These edge flanges define the axial extent of the inner coil assembly. Winding guide combs 120 are disposed at defined axial positions, around the circumference of the bobbin 20. The winding guide combs include winding cheeks 122 separated from one another by cavities, and joined by outer circumferential parts 126. The cavities define linking channels 128. The winding guide combs are separated from one another axially to define winding channels 28. Further winding channels 28' are formed between each edge flange 22 and the axially nearest winding guide comb 120. The winding guide combs are preferably arc-shaped in the circumferential direction. The winding guide combs 120, and particularly the winding cheeks 122, may be provided with tapering sides, such that the axial extent of a cheek at its radially outer surface is greater than its axial extent at its radially inner surface, to aid in later removal of combs. Similarly, the winding cheeks 122 may be provided with tapering ends, such that the circumferential extent of a cheek at its radially outer surface is greater than its circumferential extent at its radially inner surface. The cheeks are removable.

As in the example of FIG. 2, wire 12 is wound into the winding channels 28, 28' to form coils. The wire may be superconducting wire, well known in itself, particularly if a magnet for MRI imaging is to be produced. The cavities 128 may be filled with a porous preform, such as foam or glass fiber molding. During winding, the winding guide combs and porous preforms ensure that the wound wire remains within the winding channels 28, 28'. The porous preforms, in this example, reach only part of the radial dimension of the wound coil.

Once winding is complete, the coils structure and the porous preforms are impregnated with a solidifying material such as epoxy resin, which is allowed to harden. The resulting structure is a monolithic structure of the hardened material, which encloses the wire 12 and the porous preforms 34. During the impregnation step, the coils may be enclosed by a cylindrical closure plate placed over the coils and moulding cheeks, to define an annular molding cavity. In the illustrated case, all coils have an equal outer radius, once impregnation is complete. Other arrangements may be provided for, enabling the coils of the structure to have differing outer radii.

Once the impregnation process is complete, the closure plate 36, if used, is removed. The winding guide combs 120 may also be removed. The tapered sides and ends of winding cheeks 122 and radially-directed end surfaces of the combs assist in their removal from the hardened material. The winding guide combs may be covered with, or made of, a deformable material such as rubber, which would assist in their removal. The winding guide combs may be coated with a suitable release agent to assist their removal from the solidified material. Alternatively, the winding guide combs may be left in place.

Figure 13:
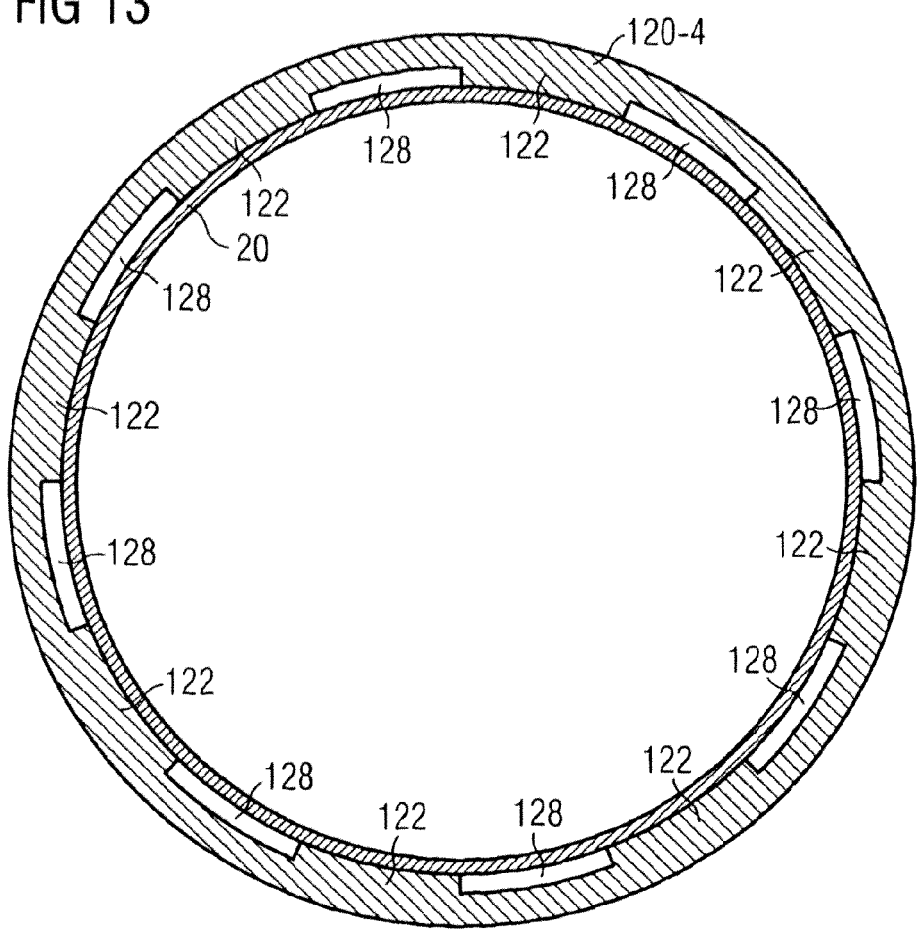

FIGS. 11, 12 and 13 illustrate possible winding guide comb arrangements. Each winding guide comb comprises at least two winding cheeks 122 separated by an outer circumferential part 126 defining a corresponding cavity for the formation of linking channels 128 between adjacent coils.

On the left-hand side of FIG. 11, a winding guide comb 120-1 is shown extending around 90° of the surface of bobbin 20. The winding guide comb 120-1 is shaped to enable removal in the direction of arrow 130-1. The radially-directed end surface 129 ensures that removal of one of the winding guide combs will not disturb the adjacent winding guide comb. The cavities have ends which are parallel to the direction of removal 130-1. This ensures that the winding guide comb will not bear upon a cross-member 16 formed within the linking channels 128 as it is removed. The cavities may be tapered to have wider radially inner ends than this. Once the impregnating material is hardened, the winding guide comb 120-1 is removed in the direction 130-1, leaving impregnated coils joined by cross-members 16 in the linking channels 128.

On the right-hand side of FIG. 11, a pair of alternative winding guide combs 120-2 is shown, each extending around 45° of the surface of bobbin 20. The winding guide combs 120-2 are shaped to enable removal in the direction of respective arrows 130-2. The radially-directed end surfaces 129 ensure that removal of one of the winding guide combs will not disturb the adjacent winding guide comb. The cavities have ends which are parallel to the respective direction of removal 130-2. This ensures that the winding guide comb will not bear upon a cross-member 16 formed within the linking channels 128 as it is removed. The cavities may be tapered to have wider radially inner ends than this.

FIG. 12 shows winding guide combs 120-3 each extending around 90° of the surface of bobbin 20. Each winding guide comb 120-3 is shaped to enable removal in the direction of respective arrow 130-3. The radially-directed end surfaces 129 ensure that removal of one of the winding guide combs will not disturb the adjacent winding guide comb. The cavities have ends which are parallel to the respective direction of removal 130-3. This ensures that the winding guide comb will not bear upon a cross-member 16 formed within the linking channels 128 as it is removed. The cavities may be tapered to have wider radially inner ends than this.

FIG. 13 shows a winding guide comb 120-4 extending fully around the surface of bobbin 20. Such winding guide combs could be formed by extrusion of a suitable material, for example. By making such a winding guide comb of resilient material, with an inner diameter slightly less than the outer diameter of the bobbin 20, the winding guide comb 120-4 will hold itself in place on the bobbin. The illustrated winding guide comb 120-4 is suitable for embodiments where the winding guide comb is left in position after coil impregnations. Alternatively, and depending on the material chosen for the winding guide comb, the winding guide comb may be broken away and discarded. In yet another variant, the winding guide comb is of flexible material, and may be peeled away from the impregnated coils once the impregnating material has hardened. In such an embodiment, the winding guide comb may be formed in several parts, suitably retained together and around the bobbin 20. The cavities have ends which are radial. This ensures that the winding guide comb will not bear upon a cross-member 16 formed within the linking channels 128 as it is removed. The cavities may be tapered to have wider radially inner ends than this.

If the winding guide comb(s) is/are to be left in place, they must be made of a material which is sufficiently strong to align the wire in the winding channels as the coils are wound, yet not so strong as to prevent flexure and relative motion of the coils in operation. An example material is structural polyurethane foam such as used in the construction industry.

The resulting impregnated coil assembly is then removed from the mould, for example by removing one of the edge flanges 22 and sliding the assembly axially off of the bobbin 20. The edge flanges and the outer surface of the bobbin may be coated with a suitable release agent to assist the removal of the solidified coil assembly.

Figure 14:
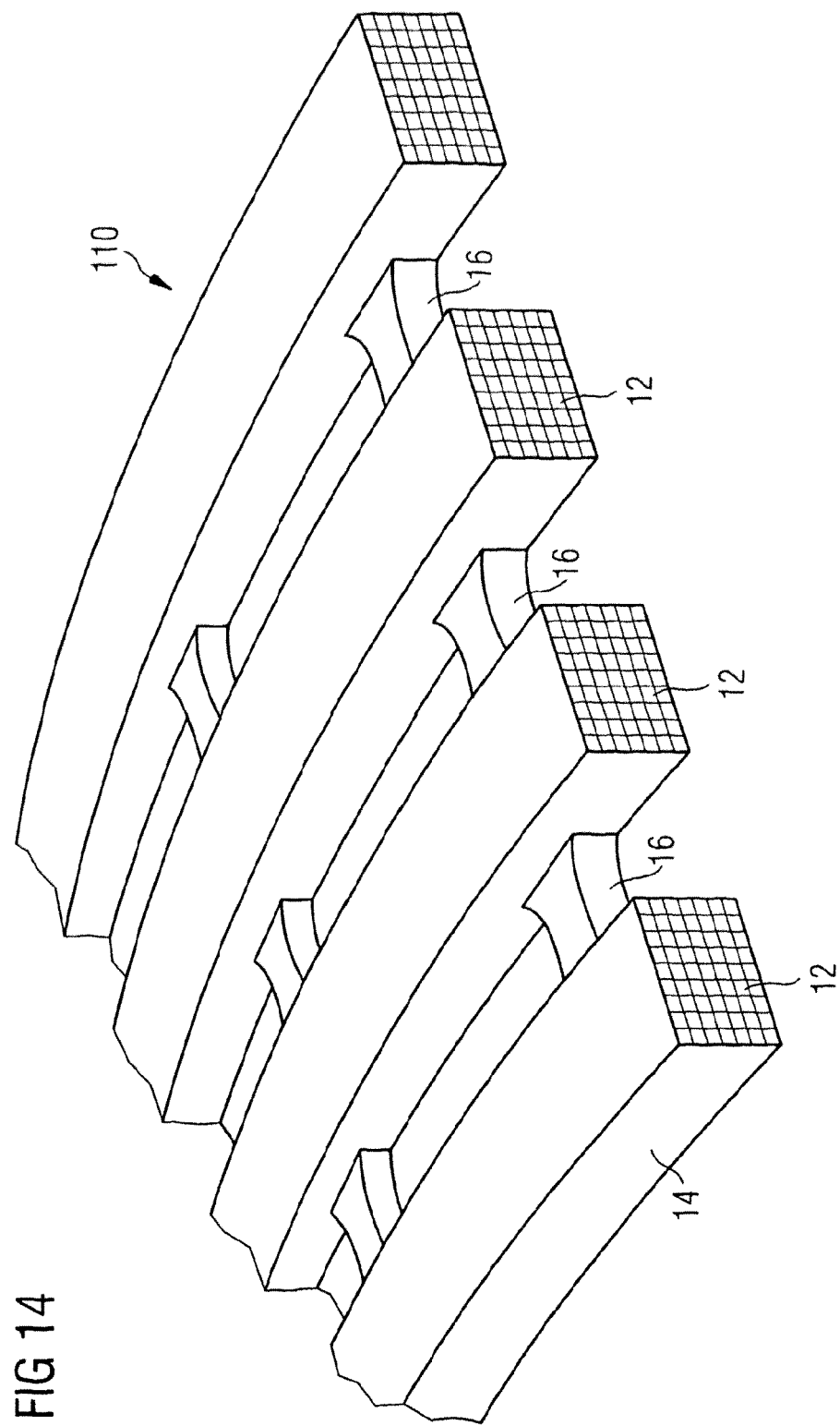
FIG. 14 illustrates a cut-away perspective view of a coil assembly according to an embodiment of the invention which may be manufactured according to the method described in relation to FIGS. 10-13.

An example of a resulting coil assembly is shown in FIG. 14 at 110. Where linking channels 128 were provided, cross-members 16 are now formed, extending only part of the radial dimension of the coil. The monolithic structure ensures that the coils 12 are firmly held in their respective relative positions.

The feature of FIG. 4 may be applied to coil assemblies such as shown in FIG. 14. Separation of the molded coils may be facilitated by stress-raising features such as notches 40.

As in the embodiments discussed above, several, or all, of the coils B, C, D, and E of the inner coil assembly 10 may be wound from a single length of wire. However, if wound from a single length of wire, it may be found expedient to pass that wire from one coil to the next through the cross-members 16. If such a solution is employed, the cross-members 16 should not be broken away.

Figure 15:
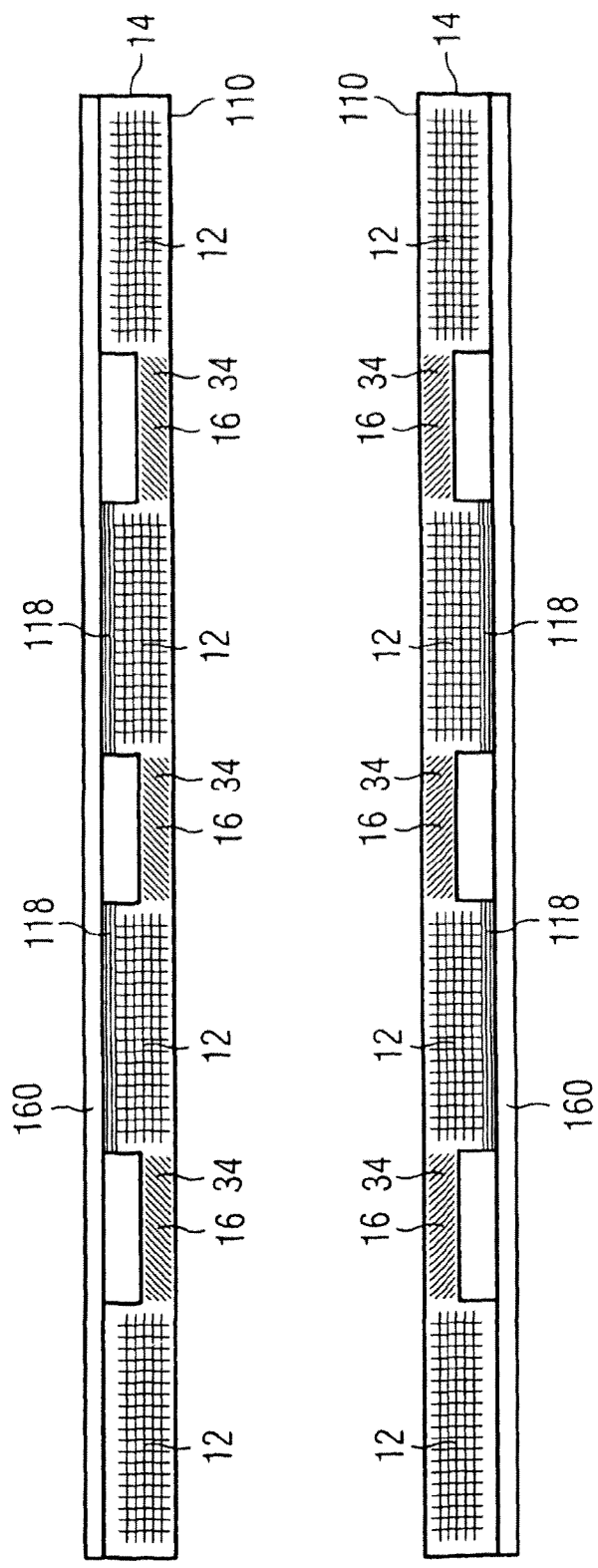
FIG. 15 illustrates a coil assembly of the present invention, such as that illustrated in FIG. 14, mounted within an external tubular coil support.

Once produced by any of the methods described above, a coil assembly 110 with essentially identical external radii of the coils 12 may be mounted inside an external tubular coil support 160, for example as illustrated in FIG. 15. While any of the described coil arrangements may be mounted in this way, FIG. 15 shows an axial cross-section of an externally-supported coil arrangement 110 such as that shown in FIG. 14. In FIG. 15, the relative position of coils 12, porous preforms 34 in cross-members 16 and an example of filler material 118, used to bring the coils to essentially identical outer radii, are shown. All of these structures are monolithically embedded within a hardened material 14, such as an epoxy resin.

Once assembled into the external tubular coil support 160, the cross-members may be broken away in the manner discussed with reference to FIG. 4, allowing the coils more freedom to expand or shrink, relatively independently, with reference to the external tubular coil support 160. The use of cross-members 16 extending only part of the radial height of the coils 12 is advantageous for this purpose. Cross-members 16 of the full radial height of the coils, as shown in FIG. 1, would be bonded to the external tubular coil support 160, and so would be very difficult to remove if desired.

The assembly of FIG. 15 may be constructed by applying an adhesive—for example, an epoxy resin, to the internal surface of the external tubular coil support 160, or the radially outer surfaces of coils 12, or both, then sliding the coil assembly 110 into the external tubular coil support 160. Alternatively, the coil assembly may be placed dry into the external tubular coil support 160, and an impregnation process applied to bond the coil assembly to the external tubular coil support 160.

The coil assemblies of the present invention rely on the structural strength of the coils themselves to provide radial and axial stability. As there is no need to fit the coils to a former, coils of unconventional cross-section may be produced by the methods of the present invention, for example, tapered coils and other non-rectangular coil cross-sections.

Shield coils may be added to the structure of FIG. 15, for example, by mounting a support structure, similar to that shown in FIGS. 5 and 9, on the exterior surface of external tubular coil support 160.

While the present invention has been described with specific reference to certain non-limiting examples, the invention provides at least some of the following advantages:

The supporting structure has only to react substantially uni-axial loads. This enables lighter structure to be used.

Use is made of a resin-impregnated coil's structural strength: the impregnated coil acts as an integral structural element in the coil assemblies of the present invention. The inherent compressive strength of the resin-impregnated composite coils is utilised to transmit the coil body forces to the axial mid-plane of the magnet.

The present invention uses only very simple tooling, such as a single bobbin 20 with end flanges 22. The tooling is therefore relatively inexpensive, and relatively robust. As the same tool is used for making many coil assemblies, the present invention will produce magnets with consistent bare-magnet homogeneity between magnets.

The large, precision-machined formers conventionally used for winding magnets are expensive in material and labour cost. They can only be sourced from a few locations worldwide. They are bulky and expensive to ship. The present invention may use compression blocks made of composite materials such as resin-impregnated glass fibre, formed in-situ during impregnation of the magnet coils. Such compression blocks are very inexpensive, and being formed in situ, do not require machining, obtaining from a third-party supplier, shipping or storage. Only sufficient stock of the component parts—filler material, hardening material and hardener, if required—must be maintained. Alternatively, compression blocks, for example of extruded aluminium, may be used. These only need to be accurately machined in the axial direction. They may be produced cheaply by any one of many manufacturers. They are lightweight and require very little space when shipping. Processing of the aluminium compression blocks after extrusion consists only of milling two opposite faces for accurate axial length, and possibly hole drilling for stress relief at corners. The shape of the compression blocks in the extrusion die may be adapted to reduce stress concentrations at the edges of the blocks.

Conventional methods for assembling superconducting coils together into an inner magnet assembly typically require multiple impregnation or bonding steps, which results in long manufacturing lead-times, and increases the opportunities for damage to the coils. The present invention provides a single-step method of impregnating coils, manufacturing and attaching spacers and mechanical support structures in the form of compression blocks, significantly speeding and simplifying the manufacturing process.

The present invention extends to other variations and modifications, as will be apparent to those skilled in the art, some examples of such modifications being described in the following paragraphs.

The coil assemblies provided by the present invention may be effectively cooled using a cryogen vessel containing a liquid cryogen. Alternatively, other cooling systems, such as conduction cooling or thermo-siphon cooling may be used with the coil assembly of the present invention, as the surfaces of the coils are readily accessible.

The inner coil assembly of the present invention may be internally or externally bonded to a supporting structure—for example, a tubular nonmagnetic structure—for improved stability of the resultant magnet. The inner coil assembly ensures accurate relative positioning of the coils within the inner coil assembly.

Most of the magnetic field is generated by the end coils 52 and the shield coils 98. The inner coils of the inner coil assembly described herein are relatively lowly loaded, but are required to be the most accurately positioned in space to create a homogeneous field required for imaging. According to the present invention, the inner coils may be manufactured as a single unit—the inner coil assembly of the present invention. This ensures that the relative position of these critical coils can be ensured, while the relatively low intrinsic loads enable the structure to operate without an external load bearing structure such as a conventional former. As can be seen from the illustration on FIG. 9, the radial mid-point of each coil is axially aligned with a part of the radial extent of the inwardly-adjacent coil, to allow the compression blocks to react the body forces of each coil without imparting a bending moment on either coil.

The present invention has been particularly explained with respect to a magnet having four inner coils 54, one pair of end coils 52 and one pair of shield coils 98. The present invention may, of course, be applied to magnets having different numbers of coils. Similarly, although the bobbin 20 described in the method of the present invention may be cylindrical or essentially cylindrical, and preferably tapered, forming circular coils, bobbins with other outer surface shapes may be used, provided that they meet the requirements of being a suitable surface upon which to wind coils, and are so shaped that they may be removed from within the completed coils.

Although modifications and changes may be suggested by those skilled in the art, it is the intention of the inventors to embody within the patent warranted heron all changes and modifications as reasonably and properly come within the scope of their contribution to the art.

We claim as our invention:

1. A magnet assembly comprising:
a plurality of coils, each of said coils being formed by multiple turns of wire embedded within monolithic structure of impregnating material formed as a cylinder with a hollow opening proceeding longitudinally therethrough, and each of said coils having a radial thickness having a mid-point;
said coils in said plurality of coils being axially aligned with respect to each with the mid-point of the radial thickness of each coil being axially aligned with a part of the radial thickness of an adjacent coil; and
compression blocks respectively provided between adjacent coils and configured to retain the coils in said plurality of coils in fixed relative positions with respect to each other, each compression block having opposing faces respectively in contact with adjacent coils at circumferential intervals, said compression blocks being separated by radial voids in said monolithic structure that proceed radially through said monolithic structure.

2. A magnet assembly as claimed in claim 1 wherein said coils and said compression blocks are impregnated with a hardened material.

3. A magnet assembly as claimed in claim 2 wherein said compression blocks are formed of a composite material comprising filler material impregnated with said hardened material, and wherein said coils and said compression blocks form said monolithic structure of said hardened material.

4. A magnet assembly as claimed in claim 3 wherein said compression block comprise stress-increasing features that facilitate selective removal of the compression blocks.

5. A magnet assembly as claimed in claim 3 wherein a wire connected to at least one of said coils proceeds through an adjacent compression block to an adjacent coil.

6. A magnet assembly as claimed in claim 5 wherein said wire has a configuration comprising:
a first layer of said wire wound on a first coil;
said wire proceeding through said adjacent compression block to said adjacent second coil and being wound into a first layer of wire on said second coil, and proceeding to all further coils in said plurality of coils to form a first wire layer on all of said coils in said plurality of coils, ending with a final coil;
said wire being wound to form a second layer on said final coil;
said wire passing back through a compression block adjacent to said final coil to another coil adjacent thereto and being wound into a second layer of said adjacent coil; and
said wire proceeding through a cross-member and being wound as a second layer of wire respectively on each of further coils proceeding back to said first coil.

7. A magnet assembly as claimed in claim 5, wherein said wire has a configuration comprising:
said wire being wound on a first coil;
said wire proceeding through a compression block adjacent to said first coil to and adjacent second coil, and being wound on said second coil; and
said wire successively passing through a further compression blocks and coils and being wound on to all further coils in said plurality of coils.

8. A magnet assembly as claimed in claim 1 wherein said coils are individually molded and impregnated with a hardened material, and joined by said compression blocks at intervals around the respective circumferences of the respective coils.

9. A magnet assembly as claimed in claim 8 wherein said compression blocks are adhesively bonded to said coils.

10. A magnet assembly as claimed in claim 8 wherein said compression blocks are formed by extrusion and are cut to respective axial length.

11. A magnet assembly as claimed in claim 8 wherein each compression block is comprised of aluminum with an anodized surface.

12. A magnet assembly as claimed in claim 8 wherein said compression blocks are extruded with an I cross-section.

13. A magnet assembly as claimed in claim 8 wherein said compression blocks are substantially rectangular, with substantially radially proceeding holes therein at respective corners thereof.

14. A magnet assembly as claimed in claim 8 comprising arcs of electrically insolating sheet material located between each compression block and each adjacent coil.

15. A magnet assembly as claimed in claim 14 wherein said arcs of electrically insulating material are attached to said compression blocks, and said coils are adhesively bonded to said arcs.

16. A magnet assembly as claimed in claim 8 wherein each compression block in a sub-set of said plurality of compression blocks have a slot proceeding substantially axially therethrough, substantially dividing each compression blocks in said sub-set of compression blocks into a plurality of radially thinner blocks, linked together.

17. A magnet assembly as claimed in claim 8 wherein one of said coils comprises layers of reinforcement, that increase a mechanical strength of said one of said coils and also increase a radial dimension of said one of said coils.

18. A magnet assembly as claimed in claim 1 wherein each of said coils comprises a tubular support structure.

19. A magnet assembly as claimed in claim 18 wherein a radially outer surface of each of said coils is bonded to an inner surface of said tubular support structure.

20. A magnet assembly as claimed in claim 18 wherein a radially inner surface of each of said coils is bounded to an outer surface of said tubular support structure.

21. A magnet assembly as claimed in claim 1 comprising shield coils having a radius that is larger than a radius of said plurality of coils, said shield coils being respectively mounted to respective compression blocks that are axially aligned.

22. A method for the production of magnet assemblies made up of several axially aligned coils, comprising the steps of:
 providing a bobbin, having an outer surface;
 providing end flanges to the bobbin, at least one of the end flanges being removable;
 disposing winding cheeks at defined axial positions on the outer surface of the bobbin, around the circumference of the bobbin, separated from one another around the circumference to define linking channels, and separated from one another axially to define winding channels;
 winding wire into the winding channels to form coils;
 impregnating the coils with a hardening material;
 impregnating the linking channels with a hardening material to form compression blocks;
 allowing the hardening material to harden; and
 removing the bobbin, the at least one removable end flange and winding cheeks from the resulting impregnated structure.

23. A method as claimed in claim 22 comprising producing porous preforms in said linking channels prior to said winding.

24. A method as claimed in claim 22 wherein said winding cheeks are arc-shaped in a circumferential direction and have radially-directed end surfaces with tapering sides, making an axial extent of each cheek at a radially outer surface thereof larger than an axial extent thereof at a radially inner surface thereof.

25. A method as claimed in claim 22 comprising providing said winding cheeks with winding guide combs, each winding guide comb comprising at least two winding cheeks separated by outer circumferential parts defining respective cavities for formation of linking channels between adjacent coils.

26. A method for the production of magnet assemblies made up of several axially aligned coils, comprising the steps of:
 providing a bobbin, having an outer surface;
 providing end flanges to the bobbin, at least one of the end flanges being removable;
 disposing solid compression blocks at defined axial positions on the outer surface of the bobbin, around the circumference of the bobbin, separated from one another around the circumference, and separated from one another axially to define winding channels;
 placing displacers circumferentially between the compression blocks;
 winding wire into the winding channels to form coils;
 impregnating the structure with a hardening material;
 allowing the hardening material to harden; and
 removing the bobbin, the at least one removable end flange and displacers from the resulting impregnated structure.

27. A method for the production of magnet assemblies made up of several axially aligned coils, comprising the steps of:
 providing a bobbin, having an outer surface;
 providing end flanges to the bobbin, at least one of the end flanges being removable;
 disposing preformed, impregnated coils on the outer surface of the bobbin, interspaced with solid compression blocks at defined axial positions, around the circumference of the bobbin, separated from one another around the circumference;
 placing displacers circumferentially between the compression blocks;
 impregnating the structure with a hardening material;
 allowing the hardening material to harden; and
 removing the bobbin, the at least one removable end flange and displacers from the resulting impregnated structure.

28. A method as claimed in claim 27 comprising laying a layer of porous PTFE over said outer surface of said bobbin and the inner surface of the end flanges, before placing or forming coils on said outer surface of said bobbin.

29. A method as claimed in claim 27 comprising placing electrically isolating arcs between said compression blocks and said coils, prior to said impregnation.

30. A method as claimed in claim 27 comprising, prior to said impregnation, providing a closure plate that encloses an annular molding cavity around the coils, said molding cavity with hardening material in said impregnation, and thereby producing an impregnated structure having a constant outer radius.

31. A method as claimed in claim 30 comprising, prior to providing said closure plate, providing filler material over an outer surface of at least some of the wound coils, thereby forming a common outer radius for said coils.

32. A method as claimed in claim 27 comprising providing said bobbin with a tapered outer surface, removing said bobbin from the impregnated structure, away from an axial center of the impregnated structure, in a direction of a larger end of said bobbin.

33. A method as claimed in claim 28 comprising forming said bobbin of two parts, each having an outer surface and each outer surface being tapered, and removing each bobbin part from the impregnated structure in a direction of a larger end of the respective bobbin part, away from an axial center of the impregnated structure.

34. A method as claimed in claim 33 comprising producing two partial magnet structures with the respective bobbin parts, and joining the partial magnetic structures together.

35. A method as claimed in claim 34 comprising joining said partial magnet structures together at respective larger-diameter sides thereof.

36. A method as claimed in claim 34 comprising joining said partial magnet structures together at respective smaller-diameter ends thereof.

* * * * *